(12) United States Patent
Berthold et al.

(10) Patent No.: US 7,658,900 B2
(45) Date of Patent: Feb. 9, 2010

(54) REACTOR AND PROCESS FOR THE PREPARATION OF SILICON

(75) Inventors: Rico Berthold, Freiberg (DE); Christian Beyer, Freiberg (DE); Armin Müller, Freiberg (DE); Carsten Pätzold, Wiednitz (DE); Torsten Sill, Freiberg (DE); Ute Singliar, Obergruna (DE); Raymund Sonnenschein, Frankfurt (DE); Gerald Ziegenbalg, Freiberg (DE)

(73) Assignee: Joint Solar Silicon GmbH & Co. KG, Freiberg (DE)

( * ) Notice: Subject to any disclaimer, the term of this patent is extended or adjusted under 35 U.S.C. 154(b) by 52 days.

(21) Appl. No.: 11/817,595

(22) PCT Filed: Mar. 3, 2006

(86) PCT No.: PCT/EP2006/001945
§ 371 (c)(1),
(2), (4) Date: Aug. 31, 2007

(87) PCT Pub. No.: WO2006/094714
PCT Pub. Date: Sep. 14, 2006

(65) Prior Publication Data
US 2008/0159942 A1  Jul. 3, 2008

(30) Foreign Application Priority Data
Mar. 5, 2005  (DE) ................. 10 2005 010 218

(51) Int. Cl.
*C01B 33/02* (2006.01)
*B01J 8/18* (2006.01)
(52) U.S. Cl. ................. 423/350; 423/349; 422/139; 422/143

(58) Field of Classification Search ............... 423/348, 423/349, 350; 422/139, 143, 145–147, 198–200, 422/202, 211, 216, 222
See application file for complete search history.

(56) References Cited

U.S. PATENT DOCUMENTS

| 4,237,150 | A | * | 12/1980 | Wiesmann | ................. 438/479 |
| 4,314,525 | A | | 2/1982 | Hsu et al. | |
| 4,341,749 | A | | 7/1982 | Iya et al. | |
| 4,354,987 | A | | 10/1982 | Iya | |
| 4,444,811 | A | * | 4/1984 | Hsu et al. | ................. 427/213 |
| 4,477,277 | A | * | 10/1984 | D'Altilia et al. | ............. 75/367 |
| 4,588,571 | A | | 5/1986 | Bildl et al. | |

(Continued)

FOREIGN PATENT DOCUMENTS

DE  1 024 937  8/1958

(Continued)

*Primary Examiner*—Timothy C Vanoy
*Assistant Examiner*—Richard M Rump
(74) *Attorney, Agent, or Firm*—McGlew and Tuttle, P.C.

(57) ABSTRACT

In a reactor for the decomposition of a silicon-containing gas, provision is made, to avoid silicon deposition on an inner wall of a reactor vessel, for at least one catalytically active mesh to be provided within a reaction chamber between at least one gas feed line and the inner wall (4). The mesh accelerates the thermal decomposition of the gas and reduces the deposition of silicon on the inner wall. Also described is a process for the preparation of silicon using the reactor according to the invention and the use in photovoltaics of the silicon prepared.

26 Claims, 3 Drawing Sheets

U.S. PATENT DOCUMENTS

| | | | |
|---|---|---|---|
| 4,642,227 | A | 2/1987 | Flagan et al. |
| 4,661,335 | A | 4/1987 | Boudot et al. |
| 4,986,971 | A * | 1/1991 | Forwald et al. ............ 423/342 |
| 5,229,102 | A | 7/1993 | Minet et al. |
| 2003/0175196 | A1 | 9/2003 | Blackwell et al. |
| 2004/0151652 | A1 | 8/2004 | Herold et al. |

FOREIGN PATENT DOCUMENTS

| | | |
|---|---|---|
| DE | 33 17 286 A1 | 11/1984 |
| DE | 36 10 713 A1 | 3/1987 |
| DE | 37 39 895 A1 | 6/1988 |
| DE | 38 39 700 C2 | 6/1989 |
| DE | 38 39 705 A1 | 6/1989 |
| DE | 39 10 343 A1 | 10/1989 |
| DE | 199 48 395 A1 | 5/2001 |
| DE | 101 24 848 A1 | 11/2002 |
| DE | 101 51 159 A1 | 4/2003 |
| DE | 102004027564 | 12/2005 |
| DE | 102004027563 | 12/2006 |
| EP | 0 450 393 A2 | 10/1991 |
| EP | 1 550 636 A1 | 7/2005 |
| JP | WO 2004035472 | 4/2004 |

* cited by examiner

REACTOR AND PROCESS FOR THE PREPARATION OF SILICON

CROSS REFERENCE TO RELATED APPLICATIONS

This application is a U.S. National Phase application of International Application PCT/EP2006/001945 and claims the benefit of priority under 35 U.S.C. § 119 of DE 102005010218.2 filed Mar. 5, 2005, the entire contents of which are incorporated herein by reference.

FIELD OF THE INVENTION

The present invention pertains to a reactor for the decomposition of a silicon-containing gas, in particular for the decomposition of monosilane or trichlorosilane. The invention further relates to a process for the preparation of silicon which is suitable as a starting material for the production of polycrystalline silicon blocks or silicon monocrystals for photovoltaics. The invention further relates to the use in photovoltaics of the silicon prepared using the process according to the invention. The invention further relates to silicon prepared using the process according to the invention.

BACKGROUND OF THE INVENTION

Processes for the preparation of high-purity silicon have long been known. DE 10 2004 027 563.7 discloses, for example, an energy and cost-efficient preparation process for high-purity silicon wherein a monosilane/hydrogen gas mixture is thermally decomposed and there results in the gas phase powdered silicon which is then mechanically compacted. In this preparation process, it is possible for the silicon which has separated out of the gas phase to be deposited as a layer on the heated inner wall of the reactor vessel. The reactor vessel consists generally of quartz glass having a different coefficient of thermal expansion from silicon. During operation of the reactor, increasing amounts of silicon are deposited on the inner wall of the reactor vessel. As a result, on the one hand, the conduction of heat from the heating device arranged outside the reaction chamber to the reaction chamber decreases and, on the other hand, after a certain period of time has elapsed the reactor vessel has to be mechanically or chemically cleansed of the deposited silicon layer. This may interrupt the operation of the reactor. In addition, the differing coefficients of thermal expansion of the reactor vessel and the silicon layer result, on cooling of the reactor vessel, in substantial forces and tensions between the deposited silicon layer and the quartz glass. This can lead to damage to the reactor vessel, in particular to tears and cracks which pass into and contaminate the deposited powdered silicon.

SUMMARY OF THE INVENTION

The object of the invention is to develop a reactor for the decomposition of a silicon-containing gas in such a way that the reactor is protected in an effective and simple manner from damage caused by deposited silicon while at the same time allowing high-purity silicon for further processing in photovoltaics to be prepared in an energy and cost-effective manner.

This object is achieved by a reactor for the decomposition of a silicon-containing gas, comprising a reactor vessel having a reaction chamber for receiving a silicon-containing gas, wherein the reaction chamber is surrounded by an inner wall, and at least one gas feed line for feeding the gas into the reaction chamber, at least one heating device for heating the reaction chamber, wherein the at least one heating device is arranged outside the reaction chamber, and at least one gas-permeable catalyst element which is arranged within the reaction chamber between the at least one gas feed line and the inner wall of the reactor vessel and has at least one material which, acting as a catalyst, accelerates the decomposition of the gas. The object is further achieved by a process for the preparation of silicon which is suitable as a starting material for the production of polycrystalline silicon blocks or silicon monocrystals for photovoltaics, including the following steps: providing a reactor for the decomposition of a silicon-containing gas, comprising a reactor vessel having a reaction chamber for receiving a silicon-containing gas and at least one gas feed line for feeding the gas into the reaction chamber, wherein the reaction chamber is surrounded by an inner wall, at least one heating device for heating the reaction chamber, wherein the at least one heating device is arranged outside the reaction chamber, and at least one gas-permeable catalyst element which is arranged within the reaction chamber between the at least one gas feed line and the inner wall of the rector vessel and has at least one material which, acting as a catalyst, accelerates the decomposition of the gas, feeding the silicon-containing gas into the reaction chamber in such a way that at least a part of the gas passes the at least one catalyst element, thermally decomposing the fed gas so as to form silicon, and separating from the gas the silicon formed. The object is also attained by silicon being prepared using the process wherein the silicon is present in the form of a powder or a compacted powder, and the powder comprises silicon particles having an average diameter of from $0.1\,\mu m$ to $20\,\mu m$. The core of the invention is that there is provided at least one gas-permeable catalyst element arranged within the reaction chamber between the at least one gas feed line and the inner wall of the reactor vessel. The catalytic effect of the catalyst element accelerates the thermal decomposition of the gas and the separation of powdered silicon from the gas phase and reduces the concentration of the silicon-containing gas directly on the inner wall of the rector vessel. This reduces the deposition of silicon on the inner wall of the reactor vessel and therefore substantially increases the operating time of the reactor, as the continuous operation of the reactor has to be interrupted for cleansing the reactor vessel merely at much longer time intervals. In addition, owing to the catalytic effect of the catalyst element, the silicon-containing gas is decomposed at much lower temperatures, thus allowing energy to be saved and improving the efficiency of the reactor. Furthermore, the accelerated thermal decomposition of the silicon-containing gas allows higher flow rates and higher concentrations of the gas in the reaction chamber, thus improving the space/time yield of the reactor and therefore increasing the reactor output.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
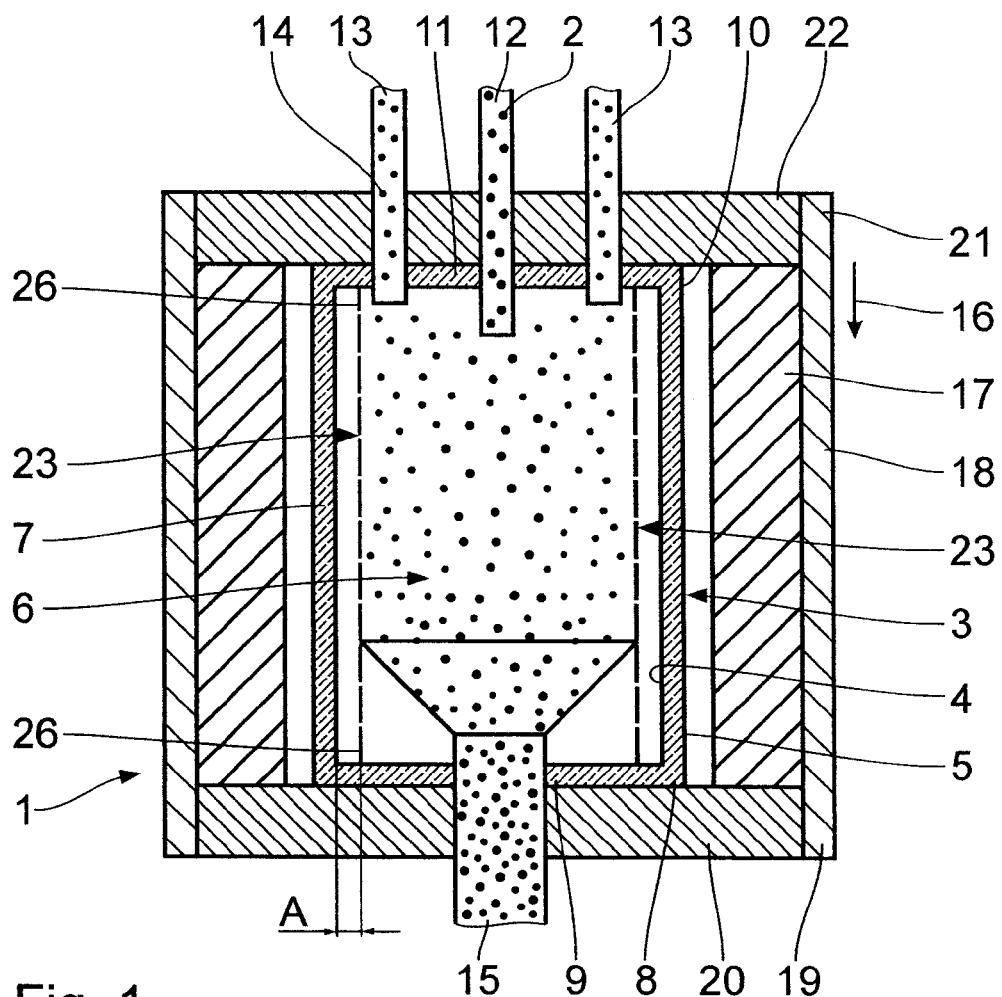
FIG. 1 is a longitudinal section through a reactor according to a first embodiment.
Figure 2:
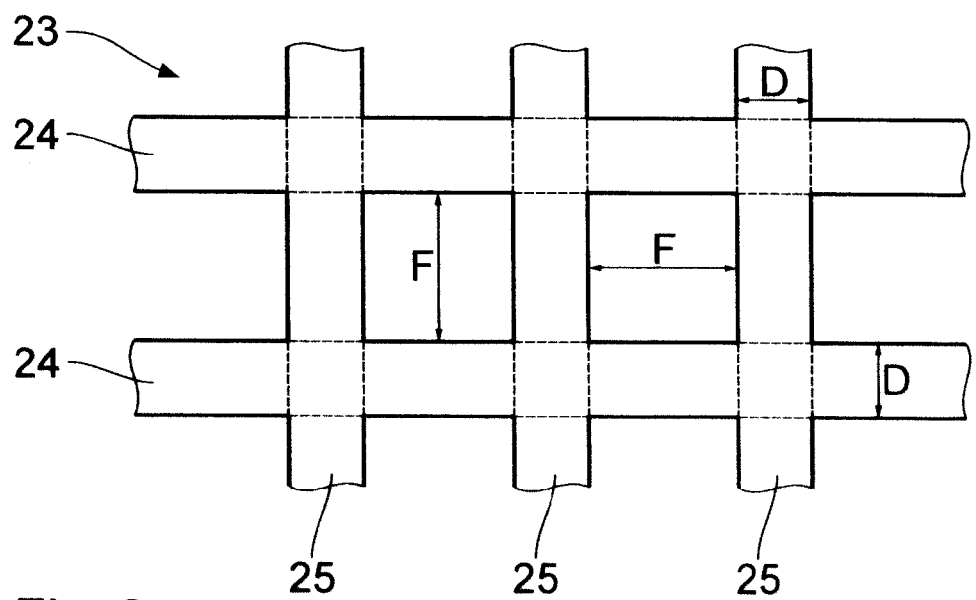
FIG. 2 is an enlarged detail of a catalyst element of the reactor according to FIG. 1.

A first embodiment of the invention will be described hereinafter with reference to FIG. 1 and 2. A reactor 1 for the decomposition of a silicon-containing gas 2 has for receiving the gas 2 a reactor vessel 3 made preferably of quartz glass, graphite, CFC or SiC. The reactor vessel 3 has an inner wall 4 and an outer wall 5, the inner wall 4 surrounding a reaction chamber 6. The reactor vessel 3 is formed by a substantially hollow cylindrical side portion 7, a disc-like base portion 9 closing the side portion 7 at a first end 8 and a disc-like cover portion 11 closing the side portion 7 at a second end 10. For feeding the gas 2 into the reaction chamber 6, there is arranged centrally to the cover portion 11 a gas feed line 12 penetrating said cover portion. Arranged concentrically with the gas feed line 12 is also an annular auxiliary gas feed line 13 which penetrates the cover portion 11 for feeding an auxiliary gas 14. Arranged opposing the gas feed line 12, centrally to the base portion 9, is a funnel-shaped gas discharge line 15 which penetrates said base portion for discharging the powdered silicon produced after the decomposition and the remaining gas 2. The gas 2 introduced into the reaction chamber 6 through the gas feed line 12 has substantially an inflow direction 16 which is perpendicular to the cover portion 11 of the reactor vessel 3, the gas 2 being surrounded by the auxiliary gas 14 in the form of a ring current.

Outside the reaction chamber 6, the reactor vessel 3 is surrounded by a hollow cylindrical heating device 17 which is electrically heatable for heating the reaction chamber 6. The heating device 17 is arranged over its entire surface area around the side portion 7 of the reactor vessel 3 and is set apart therefrom.

In order to prevent damage, the heating device 17 and the reactor vessel 3 are surrounded by a protective sleeve 18 which is hollow cylindrical in its configuration and is closed at a first free end 19 by a protective base 20 and at a second free end 21 by a protective cover 22. For feeding of the gas 2 and the auxiliary gas 14, the protective cover 22 is penetrated by the gas feed line 12 and the auxiliary gas feed line 13. Furthermore, for discharging the powdered silicon and the remaining gas 2, the protective base 20 is penetrated by the gas discharge line 15.

A gas-permeable catalyst element 23 in the form of an electrically heatable mesh is arranged within the reaction chamber 6 between the gas feed line 12 and the inner wall 4 of the reactor vessel 3. The mesh 23 is configured in the form of a hollow cylinder or cylinder jacket and oriented concentrically with the gas feed line 12 in the reaction chamber 6. The mesh 23 extends over its entire surface area along the side portion 7 of the reactor vessel 3. The mesh 23 has from the inner wall 4 of the reactor vessel 3 a radial distance A in the range of from 1 mm to 100 mm, in particular from 5 mm to 60 mm and especially from 10 mm to 50 mm. The annular auxiliary gas feed line 13 is arranged between the mesh 23 and the gas feed line 12, the radial distance from the gas feed line 12 being much greater than the radial distance from the mesh 23.

The mesh 23 consists of at least one material which is thermally stable up to a temperature of at least 1,200° C., in particular of at least 1,600° C. and especially of at least 2,000° C. This material acts as a catalyst and accelerates the decomposition of the gas 2. Advantageously, the mesh 23 consists of an alloy or a metal, in particular of at least one of the elements molybdenum, tantalum, niobium and tungsten. These elements have good electrical conductivity in conjunction with a high melting point and contaminate the powdered silicon resulting from the gas phase only slightly at a concentration of <0.1 ppma.

The mesh 23 is constructed from a plurality of transverse rods 24 set apart from one another and a plurality of longitudinal rods 25 which are arranged perpendicularly to the transverse rods 24 and set apart from one another. Each two adjacent transverse rods 24 or each two adjacent longitudinal rods 25 have a free mesh spacing F in the range of from 0.1 mm to 10 mm, in particular from 0.5 mm to 5 mm and especially from 0.9 mm to 2 mm. The rods 24, 25 are formed from a wire which is circular in cross-section and has a diameter D in the range of from 0.1 mm to 5 mm, in particular from 0.5 mm to 3 mm and especially from 0.9 mm to 2 mm. Preferably, the mesh 23 is a wire gauze or a wire netting.

In the region of its free mesh ends 26, the mesh 23 is connected at terminals to the pole of a power source (not shown). The terminals are guided into the reactor vessel 3 in a sealed manner. The free mesh spacing F and the diameter D allow the electrical resistance of the mesh 23, the maximum heating power of the mesh 23 and the surface area of the mesh 23 to be optimized relative to one another.

For separating and compacting the powdered silicon, a degassing and compacting device (not shown) is arranged after the gas discharge line 15. With regard to the construction of the degassing and compacting device, reference is made to DE 10 2004 027 563.7 and DE 10 2004 027 564.5.

There will be described hereinafter the mode of operation of the reactor 1 for the preparation of silicon which is suitable as a starting material for the production of polycrystalline silicon blocks or silicon monocrystals for photovoltaics. The silicon-containing gas 2, for example monosilane $SiH_4$ or trichlorosilane $SiHCl_3$, is introduced into the reaction chamber 6 in the inflow direction 16 through the gas feed line 12. Adjusting the inflow rate allows the residence time of the gas 2 and the concentration of the gas 2 within the reaction chamber 6 to be adjusted.

At the same time as the gas 2, the auxiliary gas 14, which surrounds the gas 2 in a substantially annular manner, is introduced in the inflow direction 3 through the auxiliary gas feed line 13, the auxiliary gas 14 streaming substantially in the inflow direction 16 along the mesh 23 and the inner wall 4. The auxiliary gas 14 used is, for example, an inert gas such as argon Ar or hydrogen $H_2$ or nitrogen $N_2$. On introduction of the gases 2, 14, the reaction chamber 6 is heated to an operating temperature $T_R$ of from 700° C. to 1,200° C. Furthermore, the mesh 23 is heated so as to have a temperature $T_G$ which is higher than a temperature $T_I$ on the inner wall 4 in the heated side portion 7 of the reactor vessel 3.

After introduction into the reaction chamber 6, the gas 2 is thermally decomposed and powdered silicon is deposited from the gas phase. The deposited powdered silicon is of a purity suitable for the preparation of silicon melt for the production of polycrystalline silicon blocks or silicon monocrystals for photovoltaics. The powdered silicon consists of silicon particles having an average diameter of from 0.1 µm to 20 µm, in particular from 2 µm to 5 µm. Adjusting the residence time of the gas 2 and the deposited silicon particles by way of the inflow rate allows the average diameter of the silicon particles to be adjusted.

The gas 2 fed in the inflow direction 16 is distributed substantially uniformly within the reaction chamber 6 and passes partially the mesh 23. In the region around the mesh 23, the catalytic effect of the mesh 23 causes accelerated thermal decomposition of the gas 2, especially as the gas passes said mesh. This process is additionally accelerated by the temperature $T_G$ of the mesh 23 which is higher than the temperature $T_R$ in the reaction chamber 6 and the temperature $T_I$ of the inner wall 4. As a result of the fact that the powdered silicon separated from the gas phase is deposited preferably on the hottest surface, the silicon deposited on the inner wall 4 is markedly reduced owing to the temperature $T_G$ of the mesh 23 which is higher than the temperature $T_I$ of the inner wall 4. In addition, owing to the accelerated decomposition of the gas 2 in the radial direction before the mesh 23 and as the gas passes the mesh 23, the concentration of the gas 2 is markedly reduced between the mesh 23 and the inner wall 4, and this also promotes the reduction of silicon particles deposited on the inner wall 4.

Owing to the catalytically active material of the mesh 23, the gas 2 is thermally decomposed at a lower temperature and this, in conjunction with the direct introduction of heat into the reaction chamber 6 through the mesh 23, results in low power consumption. The accelerated decomposition of the gas 2 improves the space/time yield and therefore the power of the reactor 1. The marked reduction in the deposition of silicon particles on the inner wall 4 of the reactor vessel 3 allows the operating time of the reactor 1 to be greatly extended without the continuous operation of the reactor 1 having to be interrupted by requisite cleansing of the reactor vessel 3. Moreover, the reactor vessel 3 is protected effectively from damage caused by the deposited silicon particles.

As a result of the annular inflow of the auxiliary gas 14 surrounding the gas 2, the concentration of the gas 2 in the region of the mesh 23 and the inner wall 4 is additionally reduced, thus also reducing the number of deposited silicon particles.

After the thermal decomposition of the gas 2, the powdered silicon and the remaining gas 2 are guided out of the reaction chamber 6 through the gas discharge line 15 and fed for separating and compacting the powdered silicon formed to the degassing and compacting device. For a detailed description of the mode of operation of the degassing and compacting device, reference is made to DE 10 2004 027 563.7 and to DE 10 2004 027 564.5.

The prepared powdered silicon has a brown color and comprises silicon particles having an average diameter of from 0.1 μm to 20 μm, in particular from 2 μm to 5 μm. The prepared powdered silicon can either be melted down directly for the production of polycrystalline silicon blocks or silicon monocrystals for photovoltaics or shaped after the melting-down process, in particular processed to form granules.

Figure 3:
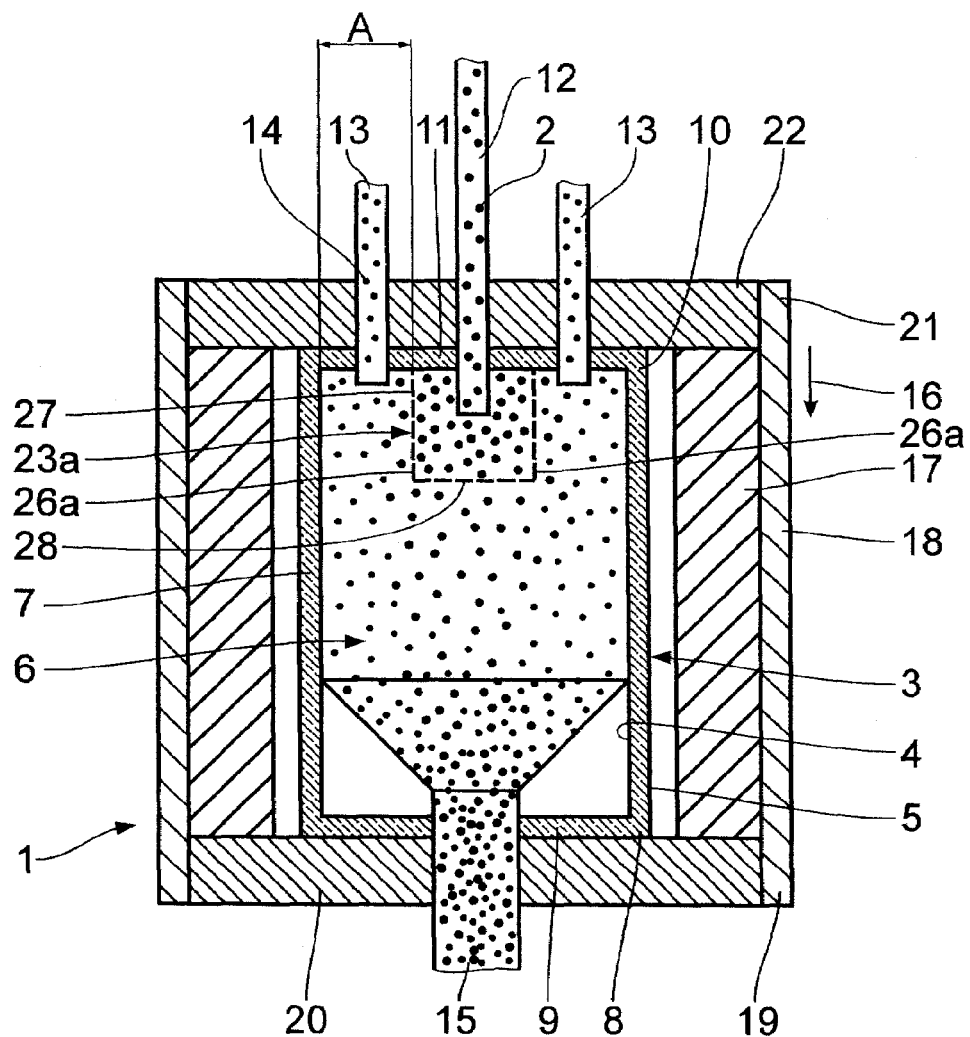
FIG. 3 is a longitudinal section through a reactor according to a second embodiment.

A second embodiment of the invention will be described hereinafter with reference to FIG. 3. Constructionally identical parts are denoted by the same reference numerals as in the first embodiment, to the description of which reference is hereby made. Parts which differ in terms of construction but are functionally identical are denoted by the same reference numerals followed by "a". The main difference from the first embodiment resides in the configuration and arrangement of the mesh 23a. The mesh 23a is configured so as completely to surround the gas feed line 12. For this purpose, the mesh 23a has a hollow cylindrical first mesh portion 27 arranged concentrically with the gas feed line 12 and between the gas feed line 12 and the auxiliary gas feed line 13. The first mesh portion 27 extends in the inflow direction 16 up to approximately one third of the reaction chamber 6 and is at a much greater radial distance A, compared to the first embodiment, from the inner wall 4 of the reactor vessel 3. At the mesh end 26a remote from the cover portion 11 of the reactor vessel 3, the first mesh portion 27 is closed off by a substantially disc-like second mesh portion 28. The mesh 23a is configured so as to be electrically heatable. For electrically heating the mesh 23a, said mesh is connected to the poles of a power source (not shown).

After the feeding of the silicon-containing gas 2 in the reaction chamber 6, there commences the thermal decomposition of the gas 2 and the separation of powdered silicon from the gas phase. Owing to the arrangement of the mesh 23a around the gas feed line 12, the gas 2 has to pass right the mesh 23a. Owing to the temperature $T_G$ of the mesh 23a and the catalytically active material of the mesh 23a, the gas 2 is thermally decomposed in an accelerated manner and substantially on passing the mesh 23a. The concentration of the gas 2 is thus markedly reduced after passing the mesh 23a, so the separation of the silicon from the gas 2 at the inner wall 4 is reduced. The concentration of the silicon-containing gas 2 is additionally reduced by the annular feeding of the auxiliary gas 14 in the region of the inner wall 4. Furthermore, owing to the temperature $T_I$ of the inner wall 4, which is lower than the temperature $T_G$ of the mesh 23a, the deposition of silicon on the inner wall 4 is also reduced.

Figure 4:
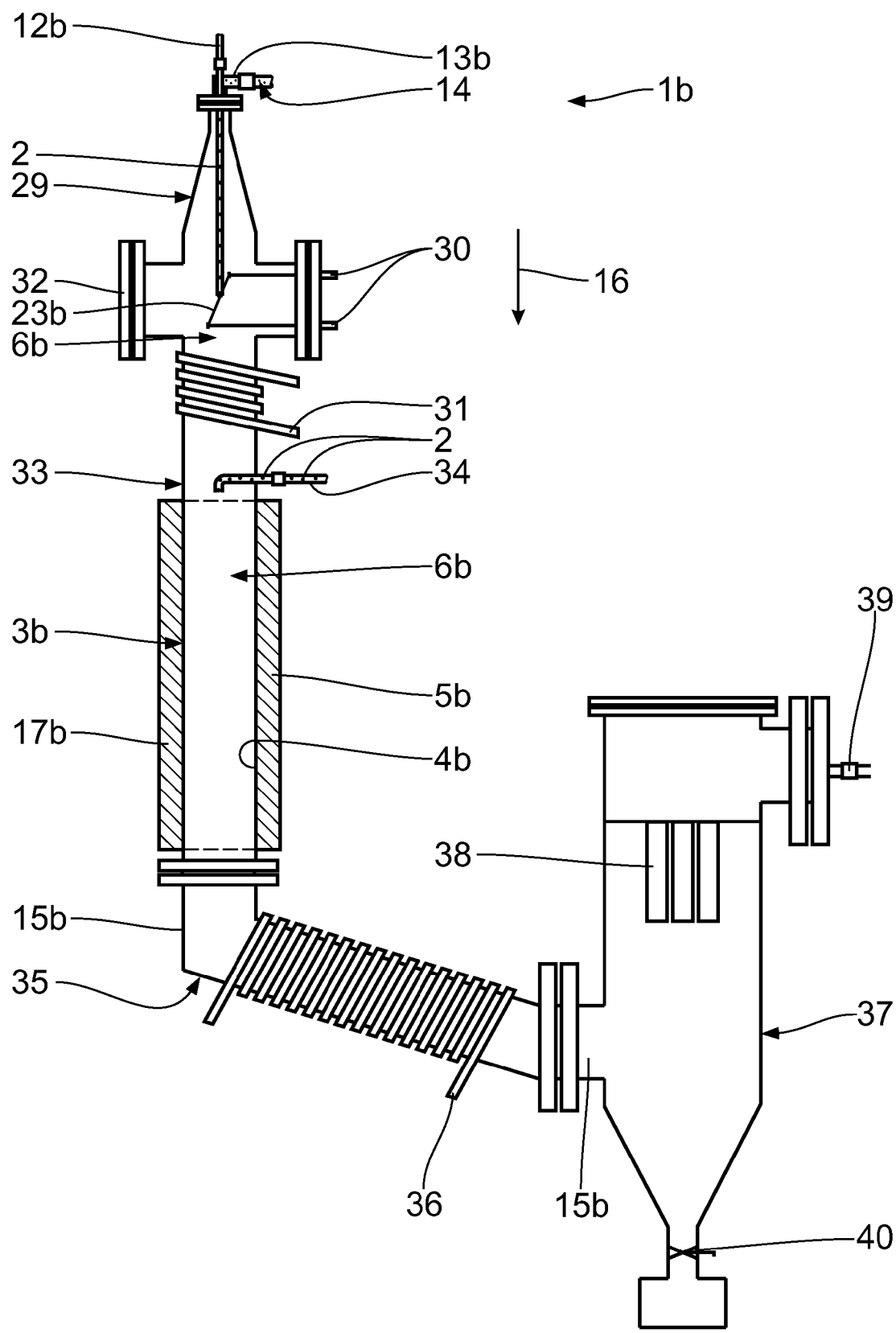
FIG. 4 is a longitudinal section through a reactor according to a third embodiment.

A third embodiment of the invention will be described hereinafter with reference to FIG. 4. Constructionally identical parts are denoted by the same reference numerals as in the first embodiment, to the description of which reference is hereby made. Parts which differ in terms of construction but are functionally identical are denoted by the same reference numerals followed by "b". The main difference from the preceding embodiments resides in the construction of the reactor 1b and in the arrangement of the catalyst element 23b.

The reactor 1b is basically broken down into three portions. In a feed portion 29, the catalyst element 23b ($SiH_4$, $H_2$, $N_2$, He) is arranged in the reactor vessel 3b. The gas feed line 12b and the auxiliary gas feed line 13b ($H_2$, $N_2$, He) open into the feed portion 29 of the reactor vessel 3b, the gas feed line 12b extending up to the catalyst element 23b, so the introduced silicon-containing gas 2 strikes the catalyst element 23b directly. The catalyst element 23b is arranged obliquely to the inflow direction 16 and configured as a mesh. The catalyst element 23b is fastened to the reactor vessel 3b using electrically conductive catalyst element terminals 30, the catalyst element terminals 30 being guided out of the reactor vessel 3b and being connectable to a power source (not shown in greater detail) for electrically heating the catalyst element 23b. Also arranged in the region of the feed portion 29 is a first cooling element 31 following the catalyst element 23b in the inflow direction 16. The first cooling element 31 is configured as a water pipeline and helically surrounds the reactor vessel 3b. For monitoring the catalyst element 23b, the reactor vessel 3b has an inspection glass 32 arranged in the region of the catalyst element 23b.

A reaction portion 33 follows the feed portion 29 in the inflow direction 16. The reaction portion 33 of the reactor vessel 3b has a further gas feed line 34 ($SiH_4$, $H_2$, $N_2$, He) opening laterally into the reactor vessel 3b. The heating device 17b follows the gas feed line 34 in the inflow direction 16 for heating the reaction chamber 6b in the region of the reaction portion 33. The distance between the catalyst element 23b and the heating device 17b is between 1 mm and 500 mm, in particular between 5 mm and 200 mm and especially between 10 mm and 100 mm.

The reaction portion 33 is followed in the inflow direction 16 by a discharge portion 35 which is surrounded by a second cooling element 36. The second cooling element 36 is also configured as a water pipeline and helically surrounds the discharge portion 35 of the reactor vessel 3b. The discharge portion 35 is adjoined by the gas discharge line 15b which opens into a degassing device 37. The degassing device 37 is used to separate from the residual gas the powdered silicon produced. Filter elements 38 and a residual gas discharge line 39 are provided for separating and discharging the residual gas. A valve 40 is also provided for discharging the separated silicon.

The mode of operation of the reactor 1b will be described in greater detail hereinafter. The silicon-containing gas 2 and the auxiliary gas 14 are introduced into the feed portion 29 of the reactor vessel 3b by way of the gas feed line 12b and the auxiliary gas feed line 13b, the auxiliary gas 14 streaming along the inner wall 4b. The gas 2 strikes the electrically heated catalyst element 23b where it becomes activated. There is substantially no thermal decomposition of the silicon-containing gas 2 in this portion of the reaction chamber 6b, i.e. in the feed portion 29. The feed portion 29 is cooled and substantially thermally decoupled from the subsequent reaction portion 33 by means of the first cooling element 31. In the region of the reactor chamber 6b, the average temperature of the gas 2 is less than 800° C., in particular less than 650° C. and especially less than 500° C.

The activated gas 2 is mixed with further silicon-containing gas 2 by way of the further gas feed line 34. This gas 2 fed in the reaction portion 33 is initially non-activated. The heating device 17b has a temperature of greater than 600° C., in particular greater than 700° C. and especially greater than 800° C. As a result of the fact that the silicon-containing gas 2 is partially activated, this temperature prompts the thermal decomposition of the gas 2, the thermal decomposition occurring more rapidly and at a lower temperature than in conventional reactors owing to the activated state generated by way of the catalyst element 23b.

The deposited silicon and the residual gas are introduced via the discharge portion 35 and the gas discharge line 15b into the degassing and compacting device 37 in which the powdered silicon is separated from the residual gas. The second cooling element 36 cools the powdered silicon and the residual gas before they enter the degassing and compacting device 37.

As a result of the fact that the catalyst element 23b is arranged in a cooled feed portion 29 and is set apart from the heating device 17b, the catalyst element 23b does not enter into contact with deposited powdered silicon, so the stability and activity of the catalyst element 23b are maintained for a much longer period of time than would be the case if the catalyst element 23b were arranged directly in the region of the heating device 17b. Activating a part of the silicon-containing gas 2 by way of the catalyst element 23b speeds up the separation of powdered silicon from the gas phase, thus increasing the space/time yield of the reactor 1b and therefore the output of the reactor 1b. The fact that the thermal decomposition occurs at a [low] temperature saves energy and improves the efficiency of the reactor 1b. Furthermore, the deposition of silicon on the inner wall 4b of the reactor vessel 3b is reduced.

In further embodiments, a further auxiliary gas feed line may be associated with the gas feed line 34. Alternatively, the second gas feed line 34 may also be dispensed with and the silicon-containing gas 2 be introduced entirely by way of the first gas feed line 12b. In principle, a plurality of different silicon-containing gases 2 and a plurality of different auxiliary gases 14 may also be used.

Furthermore, in all embodiments the gas feed line may be equipped with an additional cooling means, especially with a water cooling means. The gas feed lines may be configured as a pipe or as a nozzle, in particular as a single-fluid nozzle or as a multiple-fluid nozzle. A configuration as a two-fluid nozzle is advantageous, the silicon-containing gas preferably being guided inward.

In principle, the catalyst element may be of any desired two-dimensional or three-dimensional configuration, provided it is gas-permeable.

For example, the catalyst element may be configured as a mesh, as a tube, as a pot or as a hemisphere. It is also possible for a plurality of catalyst elements to be arranged one above another, one after another and/or next to one another, wherein each catalyst element may be connected to its own power source, so the catalyst elements may be operated at differing or identical temperatures. Furthermore, the catalyst element may be configured as a monolith having a honeycomb structure, the silicon-containing gas streaming through the honeycomb structure with or without the auxiliary gas. Also advantageous is a configuration of the catalyst element as a perforated plate or porous plate, thus allowing contact which is as intimate as possible between the silicon-containing gas and the catalyst element.

Furthermore, the catalyst element may be flush with the gas feed line or be arranged within the gas feed line, in particular from 1 mm to 100 mm, especially 2 mm to 80 mm and especially 5 mm to 50 mm within the gas feed line.

The method according to the invention may be carried out in such a way that the silicon particles have an average diameter of from 0.1 μm to 20μm, in particular from 2 μm to 5 μm. The method may, however, also be controlled differently, so as to produce silicon particles having a larger diameter, for example from 5 μm to 200 μm, in particular from 20 μm to 120 μm. These are two different possibilities for carrying out the method according to the invention.

Further embodiments of the reactor may be rotated through 180°, so the gas feed line and the auxiliary gas feed line are arranged in the base portion and the gas discharge line in the cover portion. In this embodiment, the inflow direction of the silicon-containing gas and the auxiliary gas is oriented counter to gravity. As a result of the fact that the inflow direction of the gas feed line is oriented counter to gravity, the gas has to be introduced at an inflow rate such that the gravity acting on the gas is overcome. Adjusting the inflow speed allows the residence time of the gas and the concentration of the gas within the reaction chamber to be adjusted. With regard to the further construction and the mode of operation, reference is made to the preceding embodiments.

While specific embodiments of the invention have been shown and described in detail to illustrate the application of the principles of the invention, it will be understood that the invention may be embodied otherwise without departing from such principles.

The invention claimed is:

1. Reactor for the decomposition of a silicon-containing gas, the reactor comprising:
   a reactor vessel having
      a reaction chamber for receiving a silicon-containing gas, wherein the reaction chamber is surrounded by an inner wall, and
      at least one gas feed line for feeding the gas into the reaction chamber;
   at least one heating device for heating the reaction chamber, wherein the at least one heating device is arranged outside the reaction chamber; and at least one gas-permeable catalyst element which is arranged within the reaction chamber between the at least one gas feed line and the inner wall of the reactor vessel and has at least one material which, acting as a catalyst, accelerates the decomposition of the gas.

2. Reactor according to claim 1, wherein the at least one catalyst element is electrically heatable.

3. Reactor according to claim 1, wherein the at least one catalyst element consists of at least one material which is thermally stable up to a temperature of at least 1,200° C.

4. Reactor according to claim 1, wherein the at least one catalyst element consists of a metal.

5. Reactor according to claim 1, wherein the at least one catalyst element extends at least over its entire surface area along a portion of the reactor vessel that is heated by the at least one heating device.

6. Reactor according to claim 5, wherein at least one auxiliary gas feed line for feeding an auxiliary gas is arranged between the at least one gas feed line and the at least one catalyst element.

7. Reactor according to claim 1, wherein the at least one catalyst element is configured so as to surround the at least one gas feed line.

8. Reactor according to claim 7, wherein at least one auxiliary gas feed line for feeding an auxiliary gas is arranged between the inner wall and the at least one catalyst element.

9. Reactor according to claim 1, wherein at least one cooling element is arranged between the at least one catalyst element and the heating device.

10. Reactor according to claim 1, wherein the at least one catalyst element is at a distance from the heating device in the range of from 1 mm to 500 mm along an inflow direction of the silicon-containing gas.

11. Reactor according to claim 1, wherein the reactor is configured in such a way that the silicon-containing gas in the region of the reaction chamber has an average temperature of less than 800° C.

12. Reactor according to claim 1, wherein a further gas feed line for feeding a silicon-containing gas is arranged between the at least one catalyst element and the at least one heating device.

13. Process for the preparation of silicon which is suitable as a starting material for the production of polycrystalline silicon blocks or silicon monocrystals for photovoltaics, the process comprising the following steps:
providing a reactor for the decomposition of a silicon-containing gas, comprising:
a reactor vessel having a reaction chamber for receiving a silicon-containing gas and at least one gas feed line for feeding the gas into the reaction chamber, wherein the reaction chamber is surrounded by an inner wall;
at least one heating device for heating the reaction chamber, wherein the at least one heating device is arranged outside the reaction chamber; and
at least one gas-permeable catalyst element which is arranged within the reaction chamber between the at least one gas feed line and the inner wall of the reactor vessel and has at least one material which, acting as a catalyst, accelerates the decomposition of the gas;
feeding the silicon-containing gas into the reaction chamber in such a way that at least a part of the gas passes the at least one catalyst element;
thermally decomposing the fed gas so as to form silicon; and
separating from the gas the silicon formed.

14. Process for the preparation of silicon according to claim 13, wherein the at least one catalyst element is heated at least up to a temperature which is greater than a temperature of the inner wall.

15. Process for the preparation of silicon according to claim 13, wherein the silicon-containing gas is cooled using at least one cooling element after passing the at least one catalyst element and before the thermal decomposition.

16. Process for the preparation of silicon according to claim 13, wherein the silicon-containing gas has an average temperature of less than 800° C.

17. Process according to claim 13, wherein silicon-containing gas is again fed to the reactor vessel between the at least one catalyst element and the at least one heating device.

18. Reactor according to claim 1, wherein the at least one catalyst element consists of at least one material which is thermally stable up to a temperature of at least 1,600° C.

19. Reactor according to claim 1, wherein the at least one catalyst element consists of at least one material which is thermally stable up to a temperature of at least 2,000° C.

20. Reactor according to claim 1, wherein the at least one catalyst element consists of a metal containing at least one of the elements molybdenum, tantalum, niobium and tungsten.

21. Reactor according to claim 1, wherein the at least one catalyst element is at a distance from the heating device in the range of from 5 mm to 200 mm along an inflow direction of the silicon-containing gas.

22. Reactor according to claim 1, wherein the at least one catalyst element is at a distance from the heating device in the range of from 10 mm to 100 mm along an inflow direction of the silicon-containing gas.

23. Reactor according to claim 1, wherein the reactor is configured in such a way that the silicon-containing gas in the region of the reaction chamber has an average temperature of less than 650° C.

24. Reactor according to claim 1, wherein the reactor is configured in such a way that the silicon-containing gas in the region of the reaction chamber has an average temperature of less than 500° C.

25. Process for the preparation of silicon according to claim 13, wherein the silicon-containing gas has an average temperature of less than 650° C. while passing the at least one catalyst element.

26. Process for the preparation of silicon according to claim 13, wherein the silicon-containing gas has an average temperature of less than 500° C. while passing the at least one catalyst element.

* * * * *